United States Patent [19]
Kotani et al.
[11] Patent Number: 4,972,447
[45] Date of Patent: Nov. 20, 1990

[54] PRESET COUNTER APPARATUS FOR COPYING MACHINES AND THE LIKE

[75] Inventors: Akio Kotani; Yoshiaki Takano, both of Osaka, Japan

[73] Assignee: Minolta Camera Kabushiki Kaisha, Osaka, Japan

[21] Appl. No.: 315,384

[22] Filed: Feb. 24, 1989

[30] Foreign Application Priority Data

Feb. 24, 1988 [JP] Japan ................................ 63-41419

[51] Int. Cl.[5] ........................ G06F 3/02; H03K 21/02
[52] U.S. Cl. ........................................ 377/52; 377/55; 355/308; 364/709.16; 364/709.15
[58] Field of Search .................. 355/308; 364/709.01; 377/55, 52

[56] References Cited

U.S. PATENT DOCUMENTS

| | | | |
|---|---|---|---|
| 4,105,914 | 8/1978 | Murata et al. | 355/308 |
| 4,188,529 | 2/1980 | Schochat et al. | 377/55 |
| 4,265,395 | 5/1981 | Sumikawa et al. | 377/55 |
| 4,491,827 | 1/1985 | Sugiura et al. | 355/308 |
| 4,646,330 | 2/1987 | Sugiura et al. | 355/308 |

*Primary Examiner*—John S. Heyman
*Attorney, Agent, or Firm*—Price, Gess & Ubell

[57] ABSTRACT

A preset counter apparatus for copying machines and the like having respective keys corresponding to digit positions of units and tens and a display for displaying numerical value in the digit positions of units and tens. The preset counter apparatus is so controlled that a value "0" is automatically displayed in the units digit position when the key corresponding to the tens digit is initially activated and that a value previously set in the units digit position is maintained as it is regardless of the posterior activation of the key corresponding to the tens digit.

5 Claims, 10 Drawing Sheets

PRESET COUNTER APPARATUS FOR COPYING MACHINES AND THE LIKE

BACKGROUND OF THE INVENTION

1. Field of the Invention

The present invention relates to a preset counter apparatus for use, for example, in copying machines for setting and displaying the number of copies to be made in a continuous mode of operation.

2. Description of the Related Art

U.S. Pat. No. 4,491,827 which is issued on Jan. 1, 1985 to Sugiura et al. discloses a preset counter apparatus provided in a copying machine and comprising an electric counter which is used for setting the predetermined number of copies by a so-called two key mode instead of ten key mode. By use of the preset counter apparatus of this construction, the operation for setting the copy number is improved as well as a small-sized copying machine can be produced The preset counter apparatus disclosed in U.S. Pat. No. 4,491,827 has input keys, each of which is provided in a corresponding relationship to each of the digit position of units and tens. This preset counter apparatus, independently of one another, counts up the numerical value respectively of the digit positions in response to the input by the input keys.

Further, in this preset counter apparatus, when the input key in corresponding relationship to the digit position of tens is depressed, "0" is thereby set in the digit position of units.

Therefore, this preset counter apparatus facilitates the operation for setting the copy number if the copy number to be set is 10, 20, or the like multiplied by an integer to ten. However, if the copy number is not such multiples, the setting operation is sometimes troublesome. That is, when an operator inputs the numerical value erroneously in the digit position of tens after inputting the numerical value in the digit position of units, "0" is set in the digit position of units upon the push of the input key in corresponding relationship to the digit position of tens, resulting in that the operator must input the numerical value in the digit position of units again.

SUMMARY OF THE INVENTION

The main object of the present invention is to produce a preset counter apparatus which facilitates the operation for setting the copy number.

The other object of the present invention is to produce a preset counter apparatus in which the set value in the digit position of units is maintained to be unchanged even if the value in the digit position of tens is set after setting the value in the digit position of units.

These and other objects of the present invention will be achieved by producing a preset counter apparatus which comprises display means for displaying numerical values at least in the digit positions of units and tens, a first input key provided in a corresponding relationship to the digit position of units for generating a first signal when operated, a second input key provided in a corresponding relationship to the digit position of tens for generating a second signal when operated, display control means, responsive to said first and second signals generated by the first and second keys, for varying the numerical values of each digit position of units and tens stepwise respectively, and control means for setting "0" in the digit position of units in response to the second signal when the second key is initially operated, and for maintaining the value displayed in the digit position of units regardless of the operation of the second key when the first key is initially operated.

These and other objects, advantages and features of the invention will become apparent from the following description thereof taken in conjunction with the accompanying drawings which illustrate specific embodiments of the invention.

BRIEF DESCRIPTION OF THE DRAWINGS

In the following description, like parts are designated by like reference numbers throughout the several drawings.

DETAILED DESCRIPTION OF THE PREFERRED EMBODIMENTS

Figure 1:
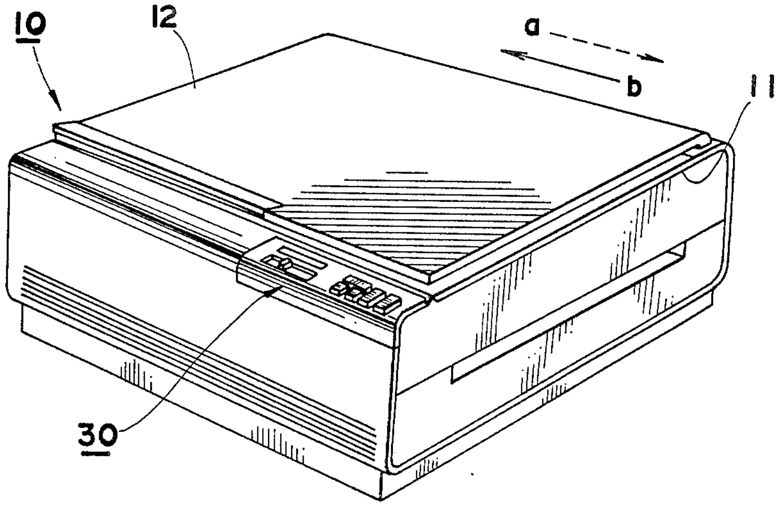
FIG. 1 is a perspective view showing the appearance of a copying machine equipped with a preset counter apparatus of the present invention.
Figure 2:
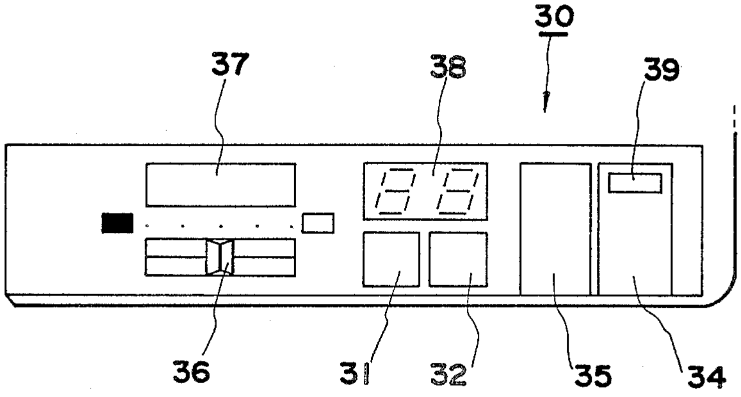
FIG. 2 is a schematic view showing an operation panel of the copying machine.

FIG. 1 is a perspective view showing the exterior appearance of a copying machine 10 including a preset counter apparatus of the present invention. FIG. 2 is a schematic view showing an operation panel 30 of the copier apparatus.

The copying machine 10 is provided on its top with an original document support glass plate 11 which is reciprocatingly movable in the directions of arrows a and b. The glass plate 11 moves with an original cover 12 to cause an. optical system, to be described subsequently, to scan an unillustrated original document to project an image thereof on a photoconductive drum 13 shown in FIG. 3.

The operation panel 30 is provided at the upper end of an outer cover on the front side of the machine main body and has a key 31 for setting a numerical value in the digit position of tens, a key 32 for setting a numerical value in the digit position of units, a print key 34, a clear key 35, an image density adjusting knob 36, a display 37 for indicating paper jams or absence of paper or toner, a number display 38 for showing numerical settings, a power supply indicator 39, etc.

Figure 3:
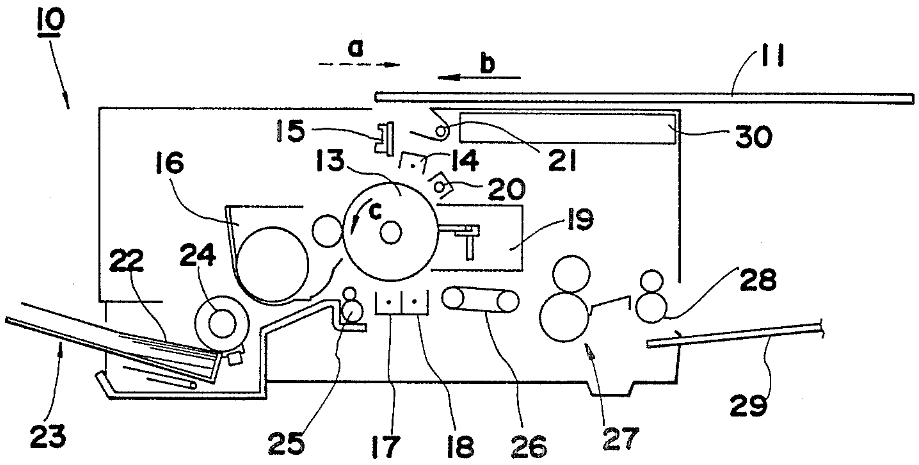
FIG. 3 is a schematic view in section showing the copying machine.

FIG. 3 is a cross sectional schematic view showing the construction of the copying machine 10. The construction and operation of the machine 10 shown in FIG. 3 are similar to those explained in U.S. Pat. No. 4,491,827.

Prior to the above copying operation by the copying machine 10, the number of copies to be made would have been preset by manipulating the keys 31, 32 provided therefor on the operation panel 30 shown in FIG.

2. In accordance with the numerical value shown on the display 38, the copying cycle described is repeated continually.

Figure 4:
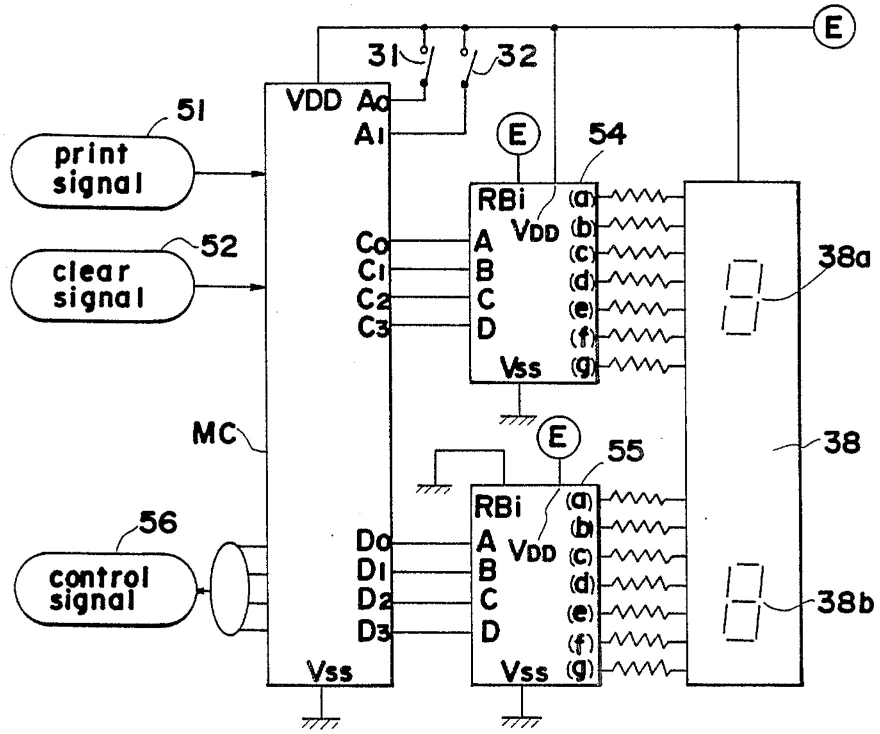
FIG. 4 is a circuit diagram showing the relationship between a display and a microcomputer for controlling the copying machine and the preset counter according to the invention.

The operation of the copying machine, including the presetting of the copy number and repetition of the copying cycle is controlled, for example, by a microcomputer MC as shown in FIG. 4. The control procedures for presetting the copy number and repeating the copy cycle will now be described with reference to FIG. 5(*a*) to FIG. (*b*) and FIG. 6(*a*) to FIG. 6(*d*).

The microcomputer MC can generally include the known elements of a central processing unit (CPU), a read-only memory (ROM), a random access memory (RAM), an accumulator (ACC), etc. This microcomputer MC receives signals from the copy number setting input keys 31, 32 and signals from the print key 34 and the clear key 35 and feeds control signals to BCD seven-segment decoders 54, 55 for controlling the numerical setting on the display 38 according to a predetermined program. The microcomputer MC also provides signals 56 for controlling the operation of the copying machine to execute a copying operation in accordance with the numerical setting. Both the decoders 54, 55, which control the number, to be represented by an arrangement of light emitting elements of seven-segment number display device 38*a*, 38*b*, are adapted to display the digits "0" to "9" with combinations of high level "H" and low level "L" of the outputs from their output terminals (a) to (g). These outputs are controlled by the microcomputer MC. According to the contemplated use, seven-segment number display devices are used in a suitable combination. Other number display means are also usable. The binary data from output terminals C0 to C3 of the microcomputer MC is converted by the decoder 54, which delivers an output for controlling the number in the tens digit position to be shown on the display portion 38*a*. The binary data from output terminals D0 to D3 is converted by the decoder 55, which gives an output for controlling the number in the units digit position to be shown on the display portion 38*b*. Since the construction of the decoders 54, 55, are already known in the prior art, these devices will not be further described.

Figure 5A:
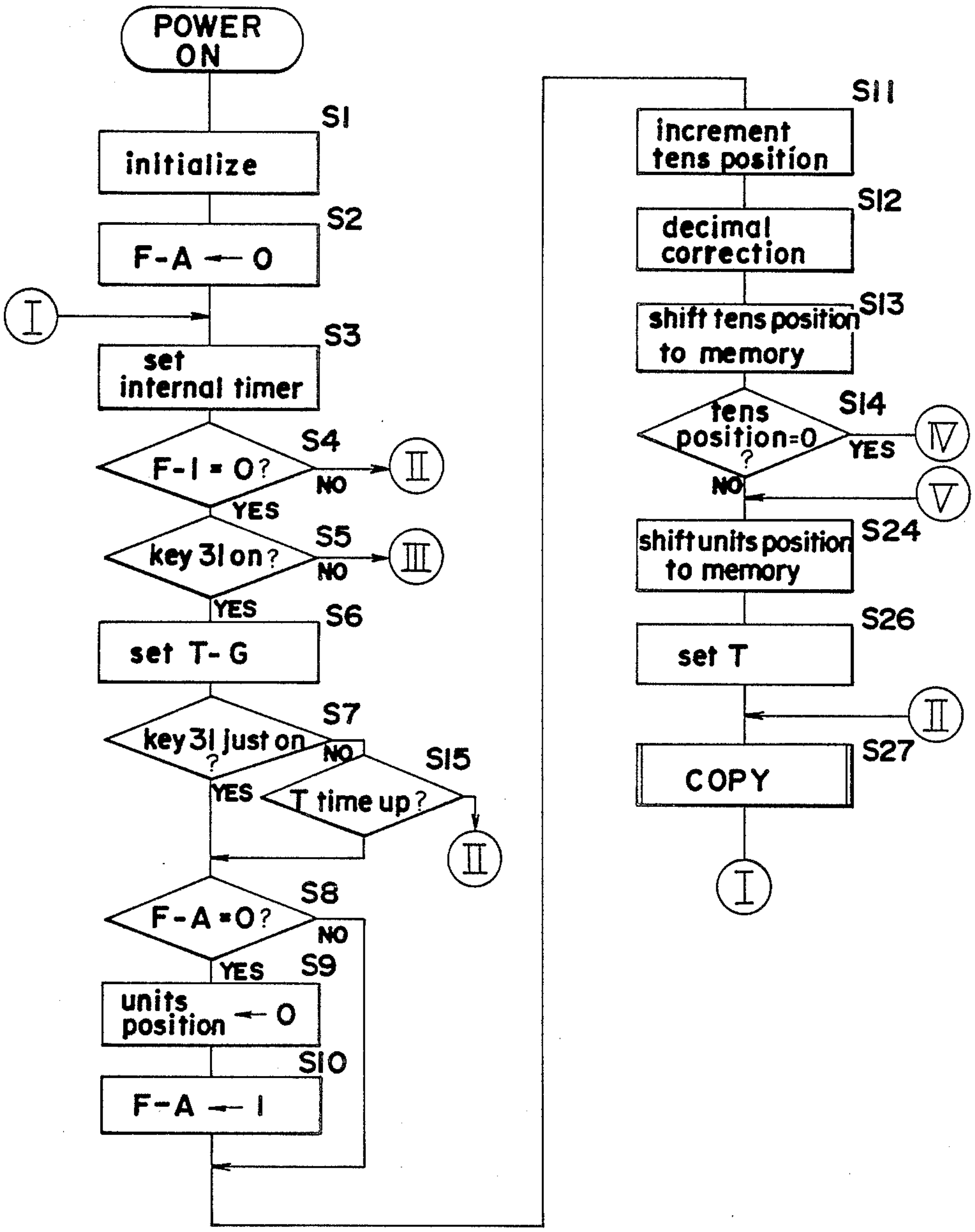
FIG. 5(*a*) and FIG. (*b*) are a series of flow charts for illustrating an embodiment of the present invention.
Figure 5B:
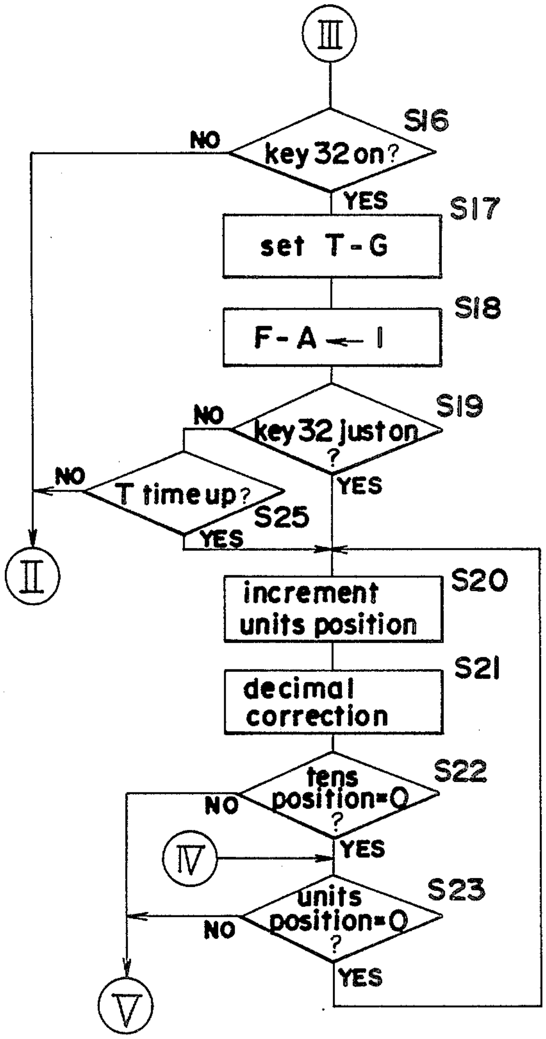
Figure 6A:
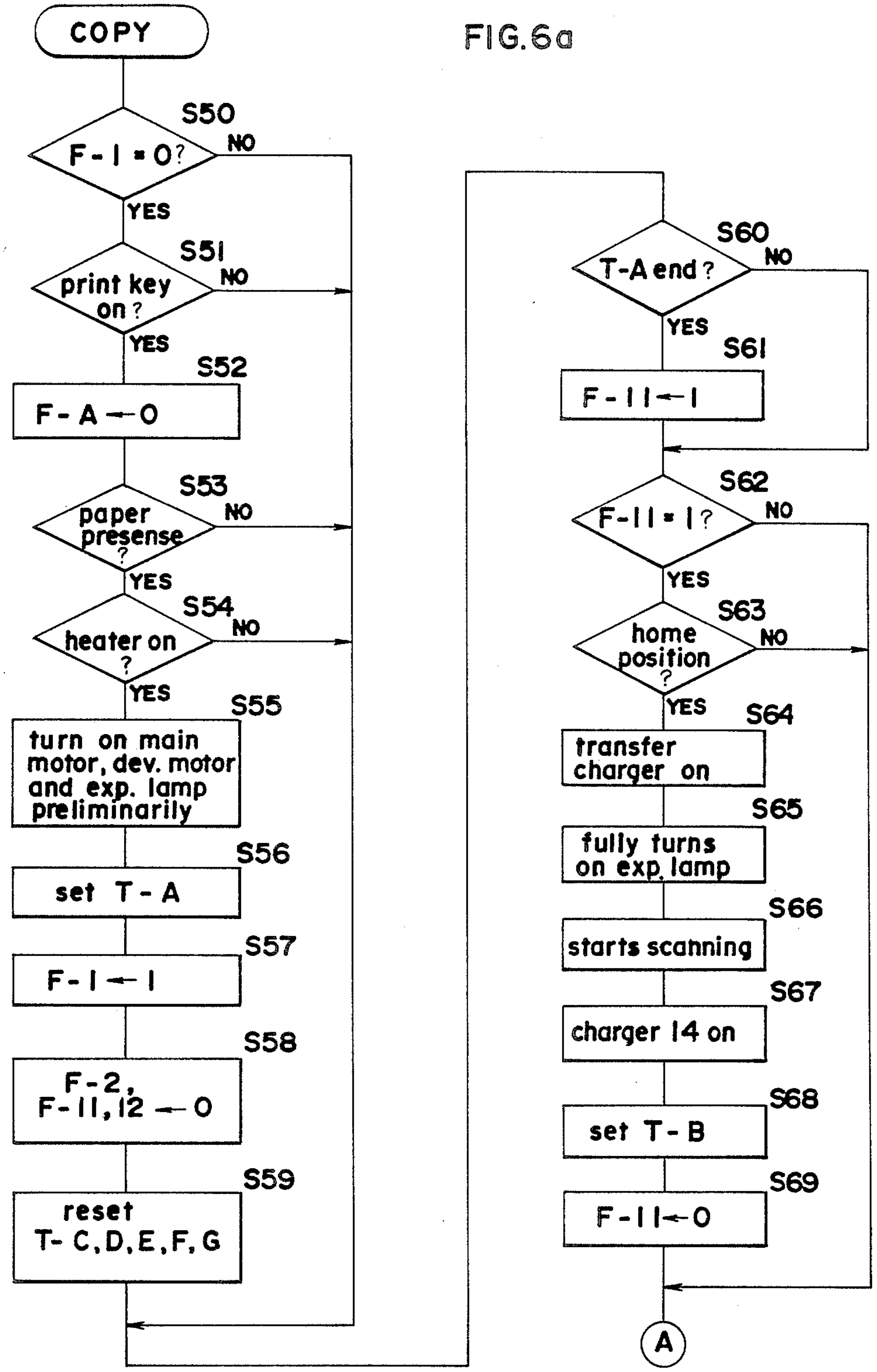
FIG. 6(*a*), FIG. (*b*), FIG. (*c*), and FIG. (*d*) are a series of flow charts for illustrating processing procedures for controlling the copying operation.
Figure 6B:
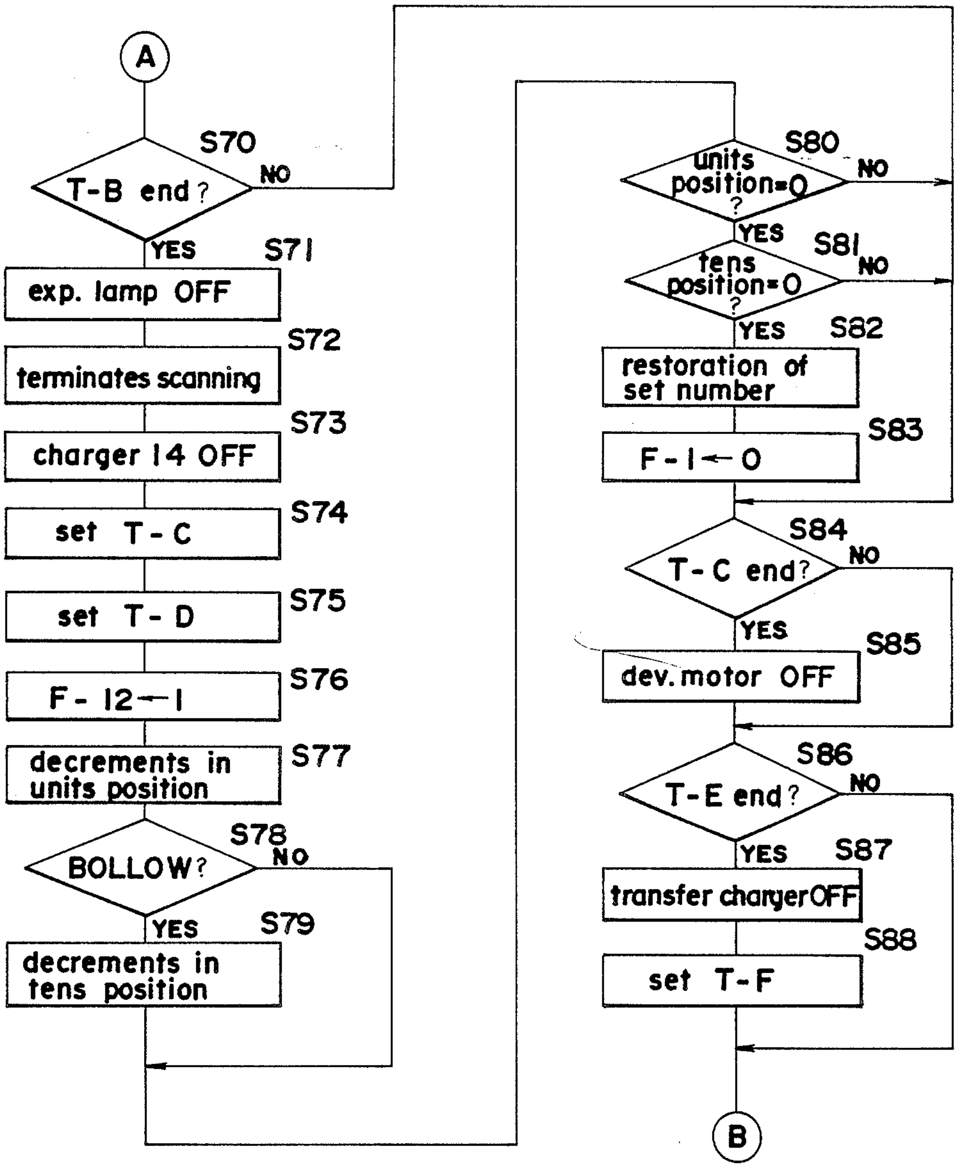
Figure 6C:
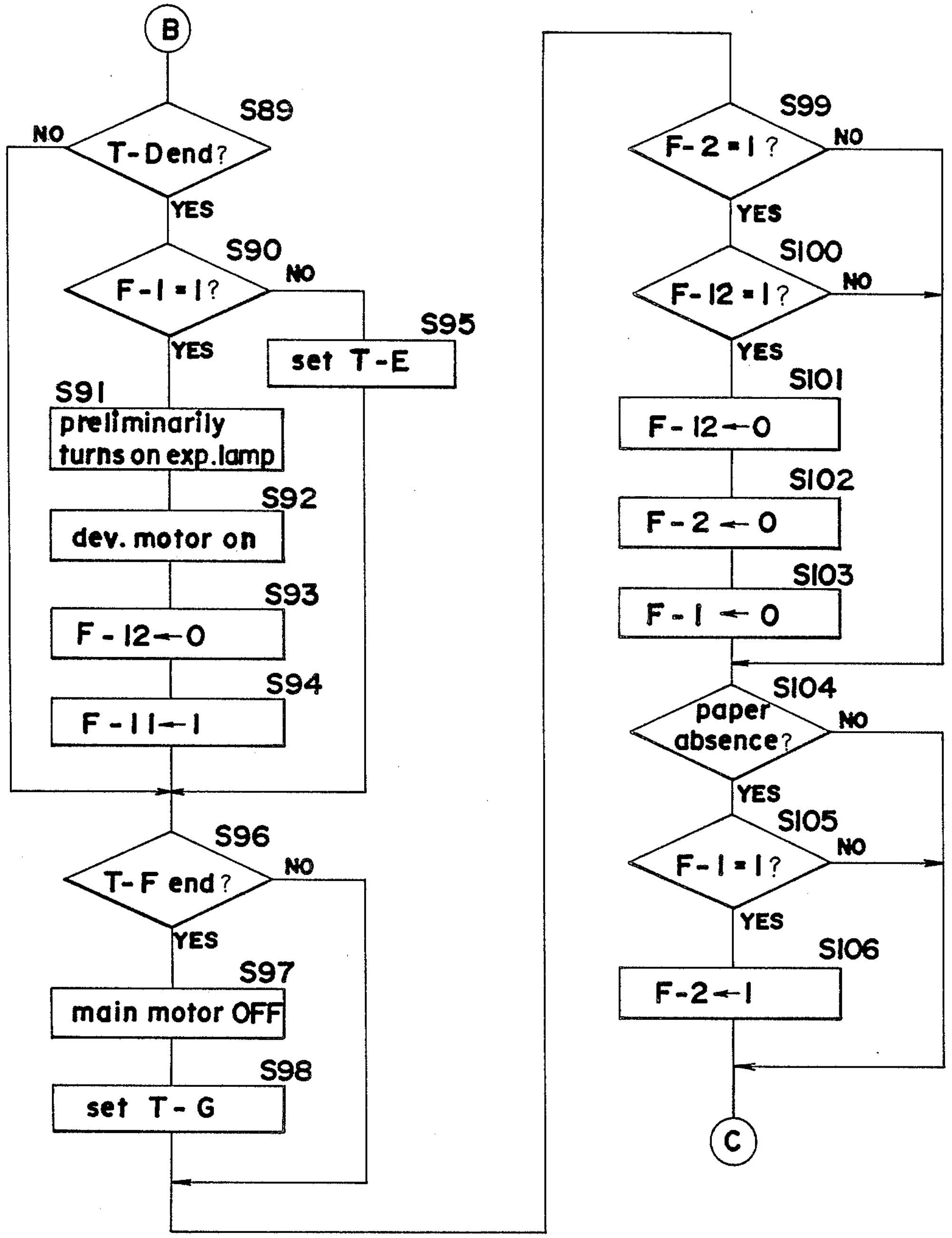
Figure 6D:
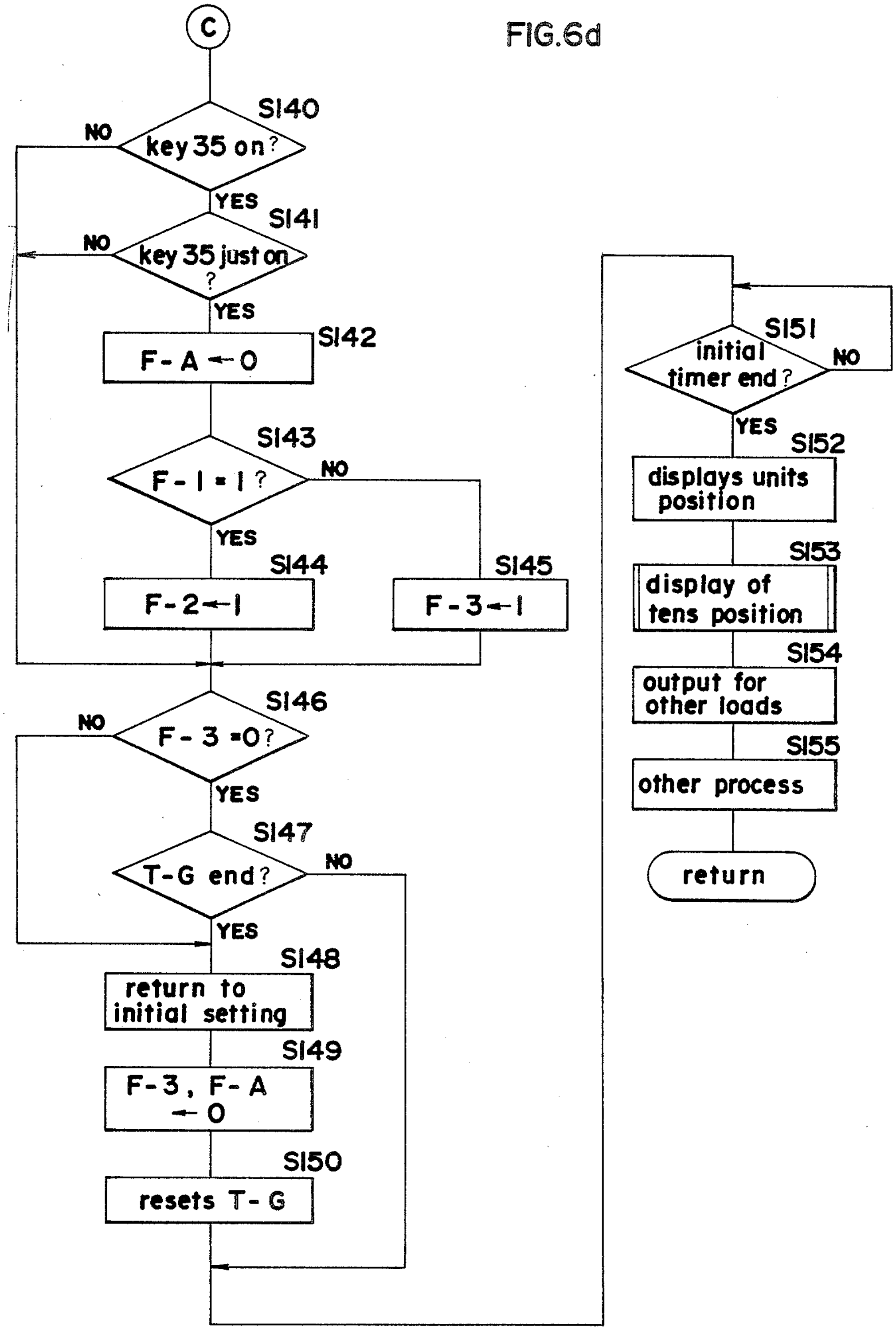

FIG. 5(*a*) is a flow chart showing an embodiment of this invention. The chart illustrates the procedures or processes performed within the microcomputer MC for setting the number of copies with the keys 31, 32. For convenience of description, the following embodiment will be described with reference to a case in which a numerical value of two digit is set since the microcomputer operates similarly for settings of three or more digits.

When the power supply is turned on for the copying machine 10 as seen in FIG. 5(*a*), firstly, in step 1 for initialization, the standard state of operation mode of the copying machine 10 is read from the internal store of the microcomputer MC, and the machine is set. The term "standard state" refers to the standard operating conditions for the copying machine, that is, for making a single copy with an equal magnification.

In step 2, a flag F–A is reset to "0". The flag F–A is provided for controlling the function that the digit position of units always has priority over the digit position of tens. In other words, the set value in the digit position of units is not changed even if the value in the digit position of tens is set following the set of the value in the digit position of units. This function is a characteristic of the present invention.

In step 3, an internal timer is set to the time for a routine of the program. In step 4, as mentioned below, a flag F-1 for indicating continuation of copying operation is checked. If it is reset to "0", step 5 follows.

The key 31 for setting a number in the digit position of tens is checked in step 5. When the result is "NO", step 16 follows for checking the key 32 for the units position. If the result is "YES", a timer T-G is set in step 6. The timer T-G functions to return the set conditions including the copy number to the standard state when no action is taken within a specified period of time after it has been set as specified. For example, it can be set for a period of about 30 seconds to about 1 minute, and is automatically reset when the print key is depressed or if the copy number setting key is manipulated in the meantime.

Step 7 checks the key 31 for its such as whether the key 31 is depressed in the current routine or in the previous routine. If the key 31 is depressed in the current routine, step 8 checks the flag F-A. When the flag F-A is reset to "0", i.e. the key 31 for setting a number in the digit position of tens is firstly operated, step 9 follows for setting a number in the digit position of units to "0". Subsequently, in step 10, the flag F-A is set to "1", and then, step 11 is performed in which "1" is added to the stored value in the tens position, followed by step 12 for decimal correction, step 13 to shift the numerical value in the tens position to the memory, and step 14 to check whether or not the value in the tens position is "0". Meanwhile, if the key 31 is depressed in the previous routine, that is, when the key 31 is held depressed, the timer T increases the numerical value by an increment of "1" upon lapse of the set time. Thus when the key 31 is held depressed, the sequence of steps 7, 15, 11, and 26 is repeated every time the set time on the timer T has elapsed, to add the increment of "1" for every elapsed time. Step 8 checks whether the flag F-A is set to "0". When the result is "NO", i.e. when the flag F-A is set to "1", step 11 follows for keeping the numerical value displayed in the units position displaying means without setting the units position to "0".

If the key 31 is not on in step 5, step 16 checks whether or not the key 32 is on. If it is on, the timer T-G is set in step 17 as in step 6. In step 18, the numerical value is set in the digit position of units by the key 32 for setting the number in the digit position of units, and then, the flag F-A is set to "1" in order to control the number set in the digit position of units independently of the setting of a numerical value in the digit position of tens, i.e. manipulation of the key 31. Step 19 detects when the key 32 is depressed. If the result is "YES", step 20 executes an increment to the value in the units position. If the result is "NO", the numerical value in the units position is incremented in steps 25 and 20 as in the above-mentioned steps 15 and 8 every time the timer T is checked for its expiry. When the count of a counter (such as is programmed in a specified area of the RAM to count up "1" in response to each increment signal) becomes "0" following the increment of the value in the units position, as shown in steps 22 and 23, the value in the units position is shifted to the memory without being changed in step 24 only if the count of the tens counter is not "0". As a result, "0" is stored in the memory as the value in the units position without being changed. Conversely if the count of the tens counter is also "0", step 23 returns to step 20 for adding an increment to the units position, followed by step 24.

In step 14, when the numerical value in the digit position of tens is set to "0" by the key 31 for setting the numerical value in the digit position of tens, in other words, when the value in the tens position=0, the same process as mentioned above is performed as shown in steps 22 and 23.

Thus, with the preset counter according to the present invention, upon the initialization of step 1 or the operation of an increment, "0" in the tens position is not displayed, while "0" in the units position can be displayed only when a value other than "0" is set in the tens position. With reference to FIG. 4, RBI terminal of the decoder 54 for controlling the number in the tens position is set to "H", while RBI terminal of the decoder 55 for controlling the number in the units position is set to "L". The decoders 54 and 55 are further so adapted that when the input terminals A to D of each decoder are all "L" (corresponding to the value "0"), the outputs (a) to (g) are all "L" (blank) if the RBI terminal is "H", or "0" is displayed (for example, (g) only is "L" and the other "H") if the RBI terminal is "L". Accordingly the value "0" is not displayed.

In step 26, when the key 31 is held depressed following the shift of the set value to the memory, the timer T is set. The timer T increases the numerical value by an increment of "1" upon lapse of the set time, for example, of about 500 msec. Thus, when the key 31 is held depressed, the sequence of steps 7, 15, and 11 or steps 19, 25, and 20 is repeated every time the set time on the timer T has elapsed, to add the increment of "1" every elapsed time period.

More specifically the copy number is set in the following manner according to the foregoing procedures.

When the power supply is turned on, the value 37 0" is set in the tens position and the value "0" in the units position by the initialization of step 1. The display 38 shows the value "1" in the units position only on the display portion 38*b*, but the display portion 38*a* for the tens position remains blank without showing "0" for the above-mentioned reason.

When a value of a single digit other than "1" is to be set, the key 32 only is used. The value is set by turning on and off the key 32 a required number of times, or by holding the key depressed. When a value of two digits is to be set, especially when the number of copies to be set is 10 multiplied by an integer, there is no need to depress the units key 32 because the value "0" is set in the units position by manipulation of the key 31 for setting the numerical value in the digit position of tens. Further, when values in the tens and units positions are to be set, either of the values in the tens and units positions may be set first. In other words, the value in the units position is not changed by manipulation of the key 31 for setting the numerical value in the digit position of tens. Through this setting operation of the value in the units position, the carry is not added to leave the tens value unaffected even when the value changes from "9" to "0". Therefore, the preset counter according to the present invention eliminates the trouble when a value is otherwise added to the tens position by missetting the value in the units position, the desired value must be set again.

FIGS. 6(*a*) to (*d*) are flow charts showing a sub routine of copy in step 27 shown in FIG. 5(*a*). For illustrative purposes, display of numerical values set according to the flow chart of FIG. 5(*a*), automatic clearing mechanism following the lapse of time set on the timer T-G, sequential control of the copying machine following the depression of the print key, etc. are shown.

The present invention is generally similar in the explanation of FIG. 6 to U.S. Pat. No. 4,491,827 except for the portion in which the present invention is characterized. Accordingly, the brief explanation of FIG. 6 will be described hereinafter because the detailed one is referred to in the above-identified U.S. Pat. No. 4,491,827which is incorporated herein by reference.

In FIG. 6(*a*), the preparatory control upon the start of copy is showed through steps 50 to 59. In step 52, the flag F-A is reset after the print key is turned on.

Through steps 60 to 69, the control upon the image scanning is performed, and then, through steps 70 to 88, the control from the expiration of the scanning to the completion of the transferring is performed. When the scanning has expired, the units count of the counter for setting the copy number is decremented (step 77). Subsequently, a borrow signal arises from the counter for the units position so that the tens count of the counter is decremented (steps 78 and 79). In the case where each of values in the tens and the units positions is "0" in steps 80 and 81, the number of copies initially set is displayed on the display in step 82 because copying the set number of copies has been completed, resulting in the flag F-1 being reset to "0".

Through steps 89 to 94, the condition of the flag F-1 is. checked, if the flag F-1 is set to "1", the preparatory action for the proceeding copy is carried out.

Through steps 96 to 98, after the lapse of time set on a timer T-F is detected, the main motor is turned off, and an auto-clear timer T-G is set.

Through steps 99 to 106, are checked the conditions for discontinuing the copying operation during the copying operation, in addition, are carried out the processes according to the result of the check.

Through steps 140 to 150, are performed the processes following the manipulation of the clear key 35 as well as the processes following the lapse of the auto-clear timer T-G. Especially in steps 142 and 149, the flag F-A is reset when the clear key 35 is turned on and the auto-clear timer T-G has expired.

Figure 7:
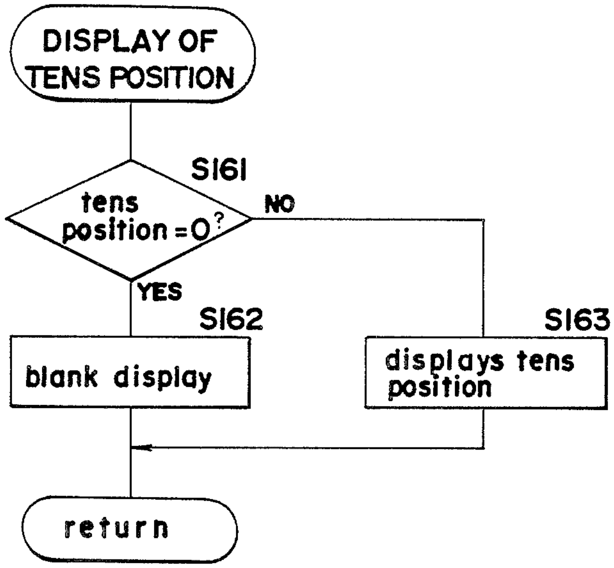
FIG. 7 is a flow chart for illustrating processing procedures for displaying the tens position.

Through steps 151 to 154, the result processed in the interior of CPU is outputted to the exterior following the expiration of an interior timer. Step 152 processes an output to be displayed in the display for the units position. Similarly, step 153 processes an output to be displayed in the display for the tens position. Step 152 will be further explained in detail with reference to FIG. 7. To sum up, step 161 checks whether or not the value in the tens position is "0" as shown in FIG. 7, if the result is "YES", a blank is displayed in step 162. If the result is "NO", the set value is displayed in step 163.

Figure 8:
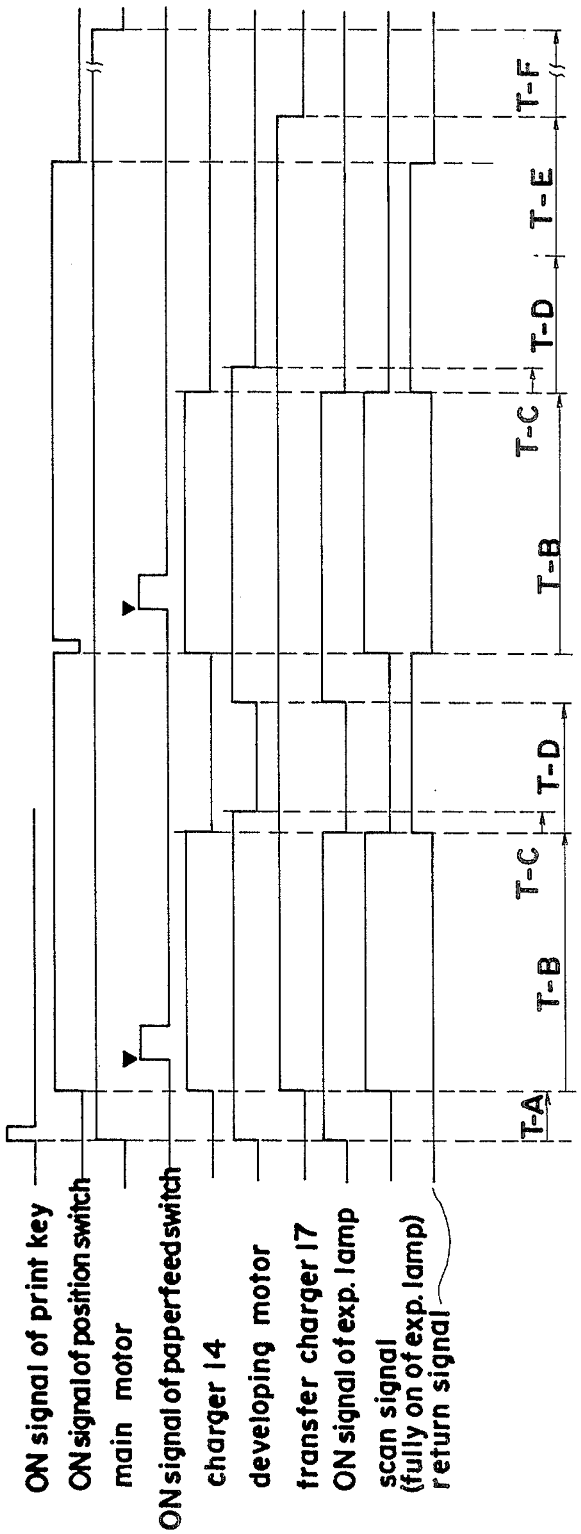
FIG. 8 is a time chart for controlling the copying operation.

Although the detection of the lapse of time set on a timer T-B is utilized in the above embodiment for subtracting a decrement from the set value for every copying cycle, also useful for this purpose are, for example, the paper feed start signal shown in FIG. 8, and the signal of a microswitch or the like, if such signal is used for returning the original support glass plate.

While the value "1" is displayed when the power supply is turned on according to the foregoing embodiment, the display may be adapted to show "1", for example, in response to a signal emitted when the heater of the fixing unit has been fully warmed up.

The preset counter apparatus of this invention is also usable for machines other than copying machines for presetting the number of repetitions of a specified operation.

According to the embodiment described above, the completion of repeated copying cycles is detected by subtracting the decrement of "1" from the set copy number during every copying cycle and resetting the flag F-1 when the values in all the digit positions have been reduced to "0", thereby preventing any copying operation from continuing. This can be achieved alternatively with the use of a memory for storing the set copy number, a counter for counting up "1" for every copying cycle and comparison means for comparing the count with the set value in the memory, such that a further copying cycle is prevented when the two values are found to match. However, the system used for the foregoing embodiment has the advantage that the copying operation can be discontinued only by detecting "0" without the need to separately provide a counter for counting the number of copying cycle, comparison means, etc.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A preset counter apparatus for copying machines and the like comprising:
- display means for displaying numerical values at least in the digit positions of units and tens;
- a first input key provided in a corresponding relation to the digit position of units for generating a first signal when operated;
- a second input key provided in a corresponding relation to the digit position of tens for generating a second signal when operated;
- display control means, responsive to said first and second signals generated by the first and second keys, for varying the numerical values of each digit position of units and tens stepwise respectively; and
- control means for setting "0" in the digit position of units in response to the second signal when the second key is initially operated, and for maintaining the value displayed in the digit position of units regardless of the operation of the second key when the first key is initially operated.

2. The invention of claim 1, wherein said display control means displays blank in the digit position of tens when the set value of the digit position of tens is "0".

3. The invention of claim 1 further including a timer for automatically incrementing the value displayed in the digit positions after a predetermined time period during a continual activation of the first and second keys respectively.

4. A preset counter apparatus for copying machines and the like, comprising:
- display means for displaying numerical values at least in the digit positions of units and tens;
- a first input key provided for the digit position of units for generating a first signal when operated;
- a second input key provided for the digit position of tens for generating a second signal when operated;
- display control means, responsive to said first and second signals generated by the first and second keys, for varying the numerical values of each digit position of units and tens stepwise respectively, and
- control means for responding to a sequence of operation of respectively the first input key and the second input key, so that if the second key is initially operated a setting of "0" is provided in the digit position of units, regardless of its preexisting value, while if the first key is initially operated the value inputted with the digit position of units is maintained regardless of the subsequent operation of the second key.

5. A preset counter apparatus for copying machines and the like, comprising:
- display means for displaying numerical values at least in the digit positions of units and tens;
- a first input key provided for the digit position of units for generating a first signal when operated;
- a second input key provided for the digit position of tens for generating a second signal when operated;
- display control means, responsive to said first and second signals generated by the first and second keys, for varying the numerical values of each digit position of units and tens stepwise respectively;
- timer means for setting a predetermined time period;
- means for determining, when the second input key is operated, whether the first input key has been previously operated within the predetermined time period and providing a corresponding signal, and
- means responsive to the corresponding signal for setting a numerical value of "0" in the digit position of units when the corresponding signal indicates that the first input key has not been operated within the predetermined time period.

* * * * *